US012343797B2

(12) United States Patent
Ljungblad

(10) Patent No.: US 12,343,797 B2
(45) Date of Patent: Jul. 1, 2025

(54) ADDITIVE MANUFACTURING METHOD AND APPARATUS WITH BEAM DUMP

(71) Applicant: Freemelt AB, Mölndal (SE)

(72) Inventor: Ulric Ljungblad, Mölndal (SE)

(73) Assignee: FREEMELT AB, Mölndal (SE)

( * ) Notice: Subject to any disclaimer, the term of this patent is extended or adjusted under 35 U.S.C. 154(b) by 855 days.

(21) Appl. No.: 17/426,702

(22) PCT Filed: Jan. 29, 2020

(86) PCT No.: PCT/EP2020/052173
§ 371 (c)(1),
(2) Date: Jul. 29, 2021

(87) PCT Pub. No.: WO2020/157137
PCT Pub. Date: Aug. 6, 2020

(65) Prior Publication Data
US 2022/0097141 A1    Mar. 31, 2022

Related U.S. Application Data

(60) Provisional application No. 62/797,962, filed on Jan. 29, 2019.

(51) Int. Cl.
*B22F 10/28*    (2021.01)
*B22F 10/36*    (2021.01)
(Continued)

(52) U.S. Cl.
CPC .............. *B22F 10/28* (2021.01); *B22F 10/36* (2021.01); *B22F 12/43* (2021.01); *B22F 12/46* (2021.01);
(Continued)

(58) Field of Classification Search
CPC .......... B22F 10/28; B22F 12/43; B22F 10/36; B22F 12/46; B33Y 10/00; B33Y 30/00; B23K 15/002
(Continued)

(56) References Cited

U.S. PATENT DOCUMENTS 4,158,140 A * 6/1979 Nakasuji ............ H01J 37/3007
250/492.2
6,252,344 B1    6/2001 Ooae et al.
(Continued)

FOREIGN PATENT DOCUMENTS

CN    1648802 A    8/2005
CN    104010749 A    8/2014
(Continued)

OTHER PUBLICATIONS

"Dual electron beam gun", Research Disclosure, Kenneth Mason Publications, Hampshire, UK, GB, vol. 636, No. 48, Apr. 1, 2017, p. 381.
(Continued)

*Primary Examiner* — Thien S Tran
*Assistant Examiner* — Simpson A Chen
(74) *Attorney, Agent, or Firm* — MEDLER FERRO WOODHOUSE & MILLS PLLC

(57) ABSTRACT

The present invention relates to an apparatus and a method for an electron beam system for manufacturing a three-dimensional object by fusing successive layers of powder, said system having at least one lens for reshaping of said electron beam, an electron source and a powder bed, said method comprising the step: blocking a selected cross section of said electron beam for controlling the electron beam power. By interference between the electron beam and a beam blocking part a portion of the electron beam is prevented from reaching the powder bed.

24 Claims, 2 Drawing Sheets

(51) Int. Cl.
*B22F 12/43* (2021.01)
*B22F 12/46* (2021.01)
*B23K 15/00* (2006.01)
*B33Y 10/00* (2015.01)
*B33Y 30/00* (2015.01)

(52) U.S. Cl.
CPC ............ *B23K 15/002* (2013.01); *B33Y 10/00* (2014.12); *B33Y 30/00* (2014.12)

(58) Field of Classification Search
USPC .................................................... 219/121.15
See application file for complete search history.

(56) References Cited

U.S. PATENT DOCUMENTS

| | | | |
|---|---|---|---|
| 11,302,507 | B2 | 4/2022 | Nishitani et al. |
| 2004/0218720 | A1* | 11/2004 | Swanson ................ H01J 35/32 378/119 |
| 2013/0300286 | A1 | 11/2013 | Ljungblad et al. |
| 2014/0348692 | A1 | 11/2014 | Bessac et al. |
| 2015/0158111 | A1* | 6/2015 | Schwarze ............... B22F 12/13 219/121.61 |
| 2015/0283611 | A1 | 10/2015 | Takezawa et al. |
| 2015/0283612 | A1 | 10/2015 | Maeda et al. |
| 2017/0136541 | A1 | 5/2017 | Fager |
| 2017/0165792 | A1 | 6/2017 | Buller et al. |
| 2019/0193192 | A1* | 6/2019 | Fager .................... H01J 37/063 |
| 2019/0389130 | A1* | 12/2019 | Richardson .......... B29C 64/194 |
| 2020/0238566 | A1 | 7/2020 | Lin et al. |

FOREIGN PATENT DOCUMENTS

| | | |
|---|---|---|
| CN | 104272425 A | 1/2015 |
| CN | 104972121 A | 10/2015 |
| CN | 106825567 A | 6/2017 |
| CN | 108698126 A | 10/2018 |
| EP | 2926979 A1 | 10/2015 |
| GB | 2338589 A | 12/1999 |
| GB | 2559579 A | 8/2018 |
| JP | 06-181029 A | 6/1994 |
| JP | 2000-011932 A | 1/2000 |
| JP | 2017-001014 A | 1/2017 |
| JP | 2019-501284 A | 1/2019 |
| JP | 2019-019352 A | 2/2019 |
| KR | 10-1480769 B1 | 1/2015 |
| WO | WO-2017/100695 A1 | 6/2017 |
| WO | 2018/109489 A1 | 6/2018 |
| WO | 2018/186294 A1 | 10/2018 |

OTHER PUBLICATIONS

Fujioka H., et al. "Electron beam blanking systems," Scanning, John Wiley & Sons, Inc., US, vol. 5, No. 1, Jan. 1, 1983.

* cited by examiner

ADDITIVE MANUFACTURING METHOD AND APPARATUS WITH BEAM DUMP

CROSS-REFERENCE TO PRIOR APPLICATIONS

This application is a § 371 National Stage Application of PCT International Application No. PCT/EP2020/052173 filed Jan. 29, 2020, which claims priority to U.S. Provisional Application No. 62/797,962 filed on Jan. 29, 2019, both of which are incorporated herein in their entirety.

TECHNICAL FIELD

This invention relates to an additive manufacturing apparatus for producing a three-dimensional object from a powder material, by fusing of the powder material layer by layer in a powder bed.

Problems with the Prior Art

In additive manufacturing apparatuses using an electron beam the electron beam source is often designed as a triode having a grid for turning of the beam. However, the triode design has got disadvantages and a diode design of the electron source is advantageous from several aspects. But the diode design lacks a grid for quickly turning on and off the electron beam. When an electron beam is used for heating and fusing the powder, it is desired to quickly control the power in the electron beam.

DESCRIPTION OF RELATED ART

It is known to shape an electron beam by forcing the beam through a small hole on the way from the beam source to the target powder surface. This shaping of the electron beam can be designed for removing of unwanted aberrations in the periphery of the beam by letting the edges of the hole interfere with the beam and preventing the outer periphery of the beam to pass the hole.

SUMMARY OF THE INVENTION

This invention relates to a method for an electron beam system for manufacturing a three-dimensional object by fusing successive layers of powder, said system having at least one lens for reshaping of said electron beam, an electron source and a powder bed, said method comprising the step: blocking a selected cross section of said electron beam for controlling the electron beam power.

In embodiments, the electron source may be a diode electron source.

In embodiments, the electron source is preferably a laser heated electron source.

In embodiments, the electron beam is variably blocked by interference with a beam blocking part.

In embodiments, said beam blocking part may be provided with a hole for at least partly letting the electron beam through.

In embodiments, said hole may be formed with a conical shape.

In embodiments, said beam blocking part is provided for at least partly receiving energy by interference with the electron beam.

In embodiments, said beam blocking part is positioned between said electron source and said powder bed.

In embodiments, said beam blocking part is positioned between said lens for reshaping of the electron beam and said powder bed.

In embodiments, said electron beam may be formed with a crossover at said beam blocking part by means of said lens for reshaping of the electron beam.

In embodiments, said reshaping of said electron beam may be a defocusing.

In embodiments, said reshaping of said electron beam may be a translation.

In embodiments, said reshaping of said electron beam may be an aberration.

This invention further relates to an apparatus for manufacturing a three-dimensional object by fusing successive layers of powder said apparatus comprising, at least one lens for reshaping of the electron beam, an electron source, a powder bed, a beam blocking part for receiving energy from the electron beam source for variably controlling the electron beam power reaching the powder bed.

In embodiments, the electron source may be a diode electron source.

In embodiments, the electron source is preferably a laser heated electron source.

In embodiments, the electron beam is variably blocked by interference with a beam blocking part.

In embodiments, said beam blocking part may be provided with a hole for at least partly letting the electron beam through.

In embodiments, said hole may be formed with a conical shape.

In embodiments, said beam blocking part is provided for at least partly receiving energy by interference with the electron beam.

In embodiments, said beam blocking part is positioned between said electron source and said powder bed.

In embodiments, said beam blocking part is positioned between said lens for reshaping of the electron beam and said powder bed.

In embodiments, said electron beam may be formed with a crossover at said beam blocking part by means of said lens for reshaping of the electron beam.

In embodiments, said reshaping of said electron beam may be a defocusing.

In embodiments, said reshaping of said electron beam may be a translation.

In embodiments, said reshaping of said electron beam may be an aberration.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF DRAWINGS

In the description of the invention references is made to the following figures, in which.

DESCRIPTION AND DISCLOSURE OF THE INVENTION

Figure 1:
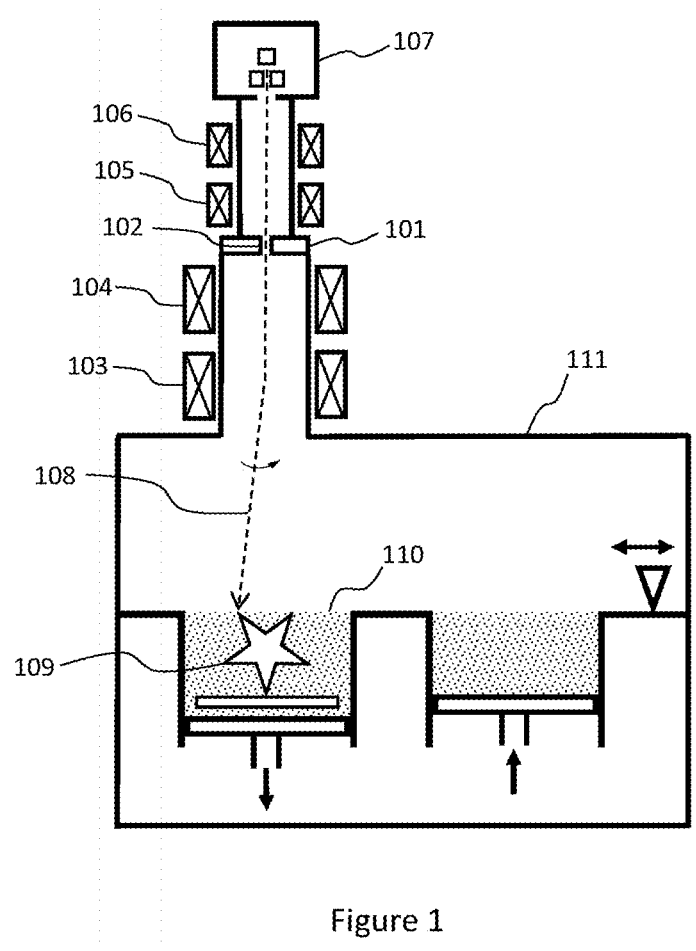
FIG. 1 show an electron beam additive manufacturing apparatus having a powder bed and an electron gun with a beam blocking part.

The disclosed additive manufacturing apparatus comprises a manufacturing chamber, an electron source, a powder bed, a beam blocking part for receiving energy from the electron beam source for controlling the electron beam power and lenses for controlling the focus and position of the electron beam at the powder bed surface. In our applications SE1951071-8 (copending) and WO2019185642A1 (published), incorporated here by reference, is also described more about the technology and additive manufacturing.

The invention being disclosed here is based on the understanding that it is possible to quickly control the electron beam current by dumping energy in the electron beam path from the source to the target. This is done by providing an electron beam source and a beam blocking lens for controlling the size or shape of the electron beam. In the beam path after said lens is preferably a beam blocking part 101 positioned. Said beam blocking part may be provided with a small aperture hole 102 positioned centrally in the beam path. Further in the beam path, after the beam blocking part, may a powder bed 110 focusing lens 104 be positioned for controlling the beam focus towards the powder bed 110 and a lens 103 for controlling the position of the beam at different positions on the powder bed. The powder bed is the target for the electron beam 108, where said beam draws a pattern for producing a three-dimensional object 109. The blocking of a selected cross section of said electron beam may be done by interference between the electron beam and the beam blocking part, for example may the selected cross section be the electron interference area at the beam blocking part or a portion of this area.

In the beam path after the electron source 107 the beam blocking lens 106 and beam blocking part 101 may be positioned for fast control of the electron beam 108 by dumping electrons in the beam blocking part. The beam blocking part is provided for variably blocking the electron beam for controlling the electron beam power by allowing a portion of the electron beam to interfere with the beam blocking part. This control may be performed by defocusing or reshaping the beam by the beam blocking lens for regulating the amount of the electron beam interfering with the beam blocking part. The blocking of the electron beam 108 is achieved by changing what percentage of the electron beam 108 is interfering with the beam blocking part 101 and what percentage is passing the beam blocking part 101. This blocking can be achieved by quickly changing characteristics of the electron beam 108 causing more or less of the electron beam 108 to interfere with the beam blocking part 101. The portion of the electron beam not interfering with the beam blocking part will pass the beam blocking part through the aperture hole 102 in the beam blocking part 101 and continue towards the powder bed 110. The diameter of the electron beam at the beam blocking part may be varied by pulsing a control signal to the beam blocking lens for controlling the beam power reaching the powder bed. Another way may be to vary the shape of the electron beam by pulsing a control signal to the beam blocking lens. It is also possible to combine beam shaping and beam diameter pulsing of the beam. By said pulsed control signal to the beam blocking lens the electron beam may be controlled for pulsed switching between beam pass and beam interference with the beam blocking part and hence a rapid control of the electron beam power reaching the target powder bed is achieved.

The beam blocking lens is preferably an electromagnetic coil. One advantage of using an electromagnetic coil is that it is a fast way of controlling the beam.

The average beam power can be controlled by high frequency pulsing of the beam, this control may be achieved either by pulse width modulation or frequency modulation, with fixed width. It is important to control the beam power to achieve good material quality during the fusing of powder. By a fast beam control it is possible to achieve an improved fusing process control for example at beam turning points and rapid beam jumping between different beam positions at the powder bed. The beam power can also be controlled using an arbitrary pulse sequence not determined by a fixed frequency or a fixed pulse width.

With the beam blocking part 101 it is possible to turn off the beam power at the powder bed 110 while shifting electron beam power at the beam source 107, i.e. shifting temperature at the cathode in the electron source. The shifting of temperature at the cathode is normally a slow process, performed e.g. by back heating of the cathode from a laser. The electron beam current can be constantly monitored using an electrical current meter regardless whether the electron beam is made to pass through the beam blocking part or if the electron beam is made to be fully or partially blocked by the beam blocking part since both the beam blocking part and the powder bed can be part of a closed electrical circuit together with the electron beam. However, it is also possible to electrically isolate the beam blocking part and monitor the electron beam current going into the beam blocking part separate from measuring the electron beam current going into the powder bed.

It is further advantageous to use the beam control for turning off the beam power during fast jumping of the electron spot at the powder bed from one position to another position. Hence charging effects of unsintered powder can be avoided. Further it is possible in this way to allow time to tune in the position of the beam spot at the powder bed before the beam is turned on, by the possibility to control the beam power provided by this invention.

When the beam power is turned off by interference between a selected cross section of the electron beam and the beam blocking part still a portion of the electron beam may pass the beam blocking 101 part through the hole 102 in the beam blocking part and hence the beam power may not be completely turned off. The beam power reaching the target 110 will be reduced when a portion of the electron beam interferes with the beam blocking part. On the other hand when the beam is turned on and most of the electron beam passes the beam blocking part, the beam power reaching the target is increased.

This invention further provides fast beam power regulation, which may be useful at turning points where the motion direction of the beam spot at the powder bed is turning and changes direction of travel. It is further also possible to achieve a quick change of beam power, due to the beam blocking control. This quick change of beam power may be useful for dynamic compensation while the slower change of beam power is performed by changing the temperature of the cathode i.e. reducing the laser power that is used to heat the cathode.

This invention discloses an apparatus and a method for an electron beam system for manufacturing a three-dimensional object 109 by fusing successive layers of electrically conductive powder, preferably metal powder. The system having at least one electromagnetic lens 106 for rapid focusing or reshaping of the electron beam 108, an electron source 107 and a powder bed 110. The apparatus is provided for variably blocking the electron beam for controlling the electron beam power by means of partial blocking of the electron beam in the beam path from the electron beam source to the powder bed target 110.

In an embodiment, shown in FIG. 1, of the invention the electron source 107 may be a diode electron source. A diode electron source lacks a grid contrary to a triode electron source, the grid in a triode is used to turn on and off the beam by means of an electric potential. The diode electron source has an emitting cathode and a high electric voltage potential is applied between the cathode and an anode, hence the emitted electrons from the cathode are accelerated towards the anode and passes through a hole in the anode forming an electron beam traveling in a beam path towards the powder bed target 110. The electrons are emitted from the cathode by heating the back side of the cathode by a laser beam, a so-called laser heated electron source.

In an embodiment, shown in FIG. 1, the electron beam 108 may be blocked by interference with a beam blocking part 101. The electron beam may be blocked by changing the focus of the electron beam and hence changing the diameter of the beam causing the periphery of the beam to interfere with the edges of the hole 102 in the beam blocking part 101. The electron beam 108 can alternatively be variably blocked by varying the beam diameter size or position over time. It is also possible to combine variations of the beam size, position and focus to achieve an interference between the electron beam 108 and the beam blocking part 101.

Further the beam blocking part 101 may be provided with a hole 102, centrally placed in the beam path, for at least partly letting the electron beam 108 through. When a centralised beam in the beam path is defocused there will be a minor portion of the beam passing through the hole 102 and a major portion of the beam will interfere with the beam blocking part 101. On the other hand if the beam is deflected away from the center of the beam path, it is possible to minimize the portion of the beam passing through the hole 102 in the beam blocking part 101.

In an embodiment the beam blocking part 101 has the shape of a plate and is positioned between the electron source 107 and said powder bed 110, further the beam blocking part 101 is preferably positioned between the beam blocking lens 106 for reshaping of the electron beam 108 and said powder bed 110. By means of the beam blocking lens an electron beam crossover may be formed at the hole in the beam blocking part. This is to letting the beam pass through the narrow hole when the beam is unblocked. A beam crossover may be defined as a focus point along the beam path. Reshaping the electron beam can be done by changing the focus, astigmatism, shape, diameter, energy distribution etc. The reshaping can also be done by a higher order of beam deformation, also called aberration.

Figure 3:
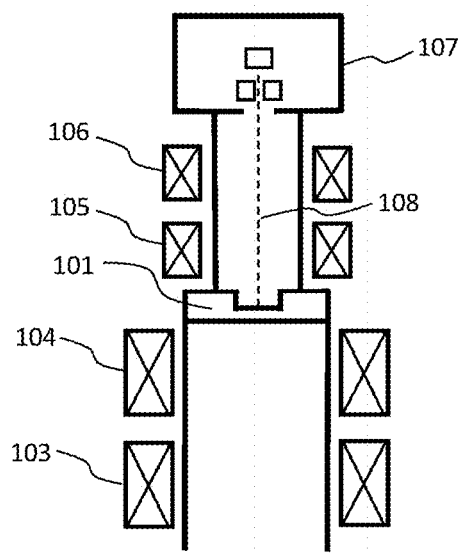
FIG. 3 show an electron gun with a beam blocking part without a hole in the beam blocking part.

In another embodiment, shown in FIG. 3, the hole or aperture in the beam blocking part 101 is being made by the electron beam 108. Starting from a beam blocking part 101 without a hole the powerful electron beam 108 is used for melting a hole in the beam blocking part. An advantage with this is that the hole is made at the correct position and with the correct size in relation to the electron beam 108. Eventual misalignment and aberrations in the system is present during the manufacturing of the hole by the electron beam 108, hence the relation between size and position of the hole and electron beam does not need to be adjusted afterwards, since the hole is made by the electron beam 108 itself.

Figure 2:
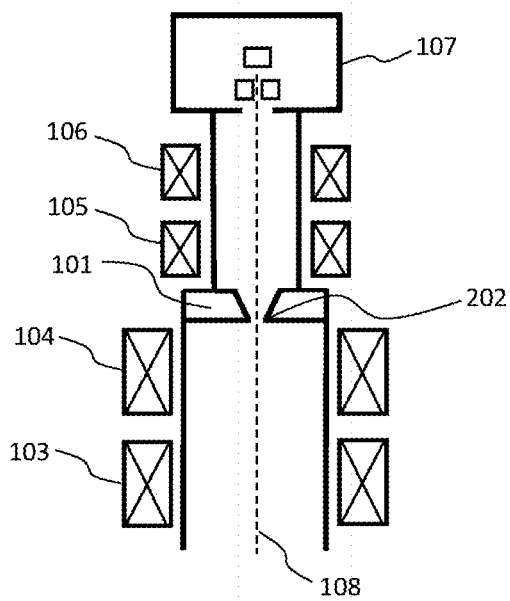
FIG. 2 show an electron gun with a beam blocking part having a conical hole.

In an alternative embodiment, shown in FIG. 2, the hole or aperture 202 in the beam blocking part 101 may be formed with a conical shape, this is advantageous since then there will be an increased area of the beam blocking part 101 in interference with the electron beam 108 when the electron beam 108 is defocused or reshaped for reduced power reaching the powder bed 110. This reduces the amount of local heating by the electron beam 108 in the beam blocking part as compared with a beam blocking part not formed with hole having a conical shape. It is also advantageous since in this way more of the back scatter electrons resulting from the interference of the electron beam 108 with the beam blocking part 101 will interfere with the opposite side of the hole 202 instead of travelling back towards the cathode, due to the angle of incidence of the electron beam 108 towards the conical hole 202.

In an alternative embodiment the electron beam may be controlled for partial interference with the beam blocking part by deflecting the electron beam by a deflection lens. It is also possible to use a combination of a focus lens and a deflection lens for achieving interference between the electron beam and the beam blocking part. The deflection lens is preferably an electromagnetic coil. One advantage of using an electromagnetic coil is that it is a fast way of controlling the beam.

In an alternative embodiment the electron beam may be controlled for partial interference with the beam blocking part by reshaping the electron beam by an electromagnetic coil to achieve interference between the electron beam and the beam blocking part. Reshaping of the electron beam energy distribution from the electron source can also be performed by shaping the energy distribution of the electron beam with a double peak in cross section. However, going slightly out of focus brings the beam shape into a gaussian energy distribution. This is advantageous for achieving a minimum of energy passing the centrally positioned aperture in the beam blocking part, due to the nature of the electron beam with an energy minimum in center when having a double peak in cross section.

In is also advantageous to use the beam blocking part for scraping off or filtering away undesirable peripheral aberrations by means of the aperture hole in the beam blocking part, to achieve an improved spot at the target powder bed.

The object of this invention is to provide an efficient control method for regulating the power of the electron beam towards the powder bed in an additive manufacturing system by pulsed dumping of a portion of the electron beam in a beam blocking part for fast change of the electron beam power. This object is achieved by the method defined in the independent claims. The dependent claims contain advantageous embodiments, variants and further developments of the invention.

What is claimed is:

1. A method for an electron beam system for manufacturing a three-dimensional object by fusing successive layers of powder, said system having at least one lens for reshaping of said electron beam, an electron source and a powder bed, said method comprising the step: selectively blocking a selected cross section of said electron beam by providing a beam blocking part positioned between said at least one lens for reshaping of said electron beam and said powder bed and actively controlling said at least one lens for reshaping of said electron beam to control the amount of beam power blocked by said beam blocking part and thereby the electron beam power that reaches the powder bed, wherein, during said selectively blocking, interference between the selected cross section of said electron beam and the beam blocking part can turn off beam power to the powder bed.

2. The method according to claim 1, wherein the electron source is a diode electron source.

3. The method according to claim 1, wherein the electron source is a laser heated electron source.

4. The method according to claim 1, wherein said beam blocking part is provided with a hole for at least partly letting the electron beam through.

5. The method according to claim 4, wherein said hole is formed with a conical shape.

6. The method according to claim 1, wherein said beam blocking part is provided to at least partly receive energy by interference with the electron beam.

7. The method according to claim 1, wherein said beam blocking part is positioned between said electron source and said powder bed.

8. The method according to claim 1, wherein said beam blocking part is positioned between said lens for reshaping of the electron beam and said powder bed.

9. The method according to claim 1, wherein said electron beam is formed with a crossover at said beam blocking part by means of said lens for reshaping of the electron beam.

10. The method according to claim 1, wherein said reshaping of said electron beam is a defocusing.

11. The method according to claim 1, wherein said reshaping of said electron beam is a translation.

12. The method according to claim 1, wherein said reshaping of said electron beam is an aberration.

13. An apparatus for manufacturing a three-dimensional object by fusing successive layers of powder said apparatus comprising, at least one lens for reshaping of the electron beam, an electron source, a powder bed, a beam blocking part positioned between said at least one lens for reshaping of said electron beam and said powder bed and configured to receive energy from the electron beam source, wherein said apparatus is configured to variably and selectively control the amount of beam power blocked by said beam blocking part and thereby the electron beam power reaching the powder bed by actively controlling said at least one lens for reshaping of the electron beam, wherein said apparatus is further configured to turn off beam power to the powder bed by actively controlling said at least one lens for reshaping of the electron beam.

14. The apparatus according to claim 13, wherein the electron source is a diode electron source.

15. The apparatus according to claim 13, wherein the electron source is a laser heated electron source.

16. The apparatus according to claim 13, wherein said beam blocking part is provided with a hole for at least partly letting the electron beam through.

17. The apparatus according to claim 16, wherein said hole is formed with a conical Shape.

18. The apparatus according to claim 13, wherein said beam blocking part is provided to at least partly receive energy by interference with the electron beam.

19. The apparatus according to claim 13, wherein said beam blocking part is positioned between said electron source and said powder bed.

20. The apparatus according to claim 13, wherein said beam blocking part is positioned between said lens for reshaping of the electron beam and said powder bed.

21. The apparatus according to claim 13, wherein said electron beam is formed with a crossover at said beam blocking part by means of said lens for reshaping of the electron beam.

22. The apparatus according to claim 13, wherein said reshaping of said electron beam is a defocusing.

23. The apparatus according to claim 13, wherein said reshaping of said electron beam is a translation.

24. The apparatus according to claim 13, wherein said reshaping of said electron beam is an aberration.

* * * * *